(12) United States Patent
Palumbo

(10) Patent No.: US 7,071,741 B2
(45) Date of Patent: Jul. 4, 2006

(54) INTERRUPT-BASED PHASE-LOCKED FREQUENCY MULTIPLIER

(75) Inventor: Daniel L. Palumbo, Newport News, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 78 days.

(21) Appl. No.: 10/943,825

(22) Filed: Sep. 17, 2004

(65) Prior Publication Data

US 2006/0061396 A1    Mar. 23, 2006

(51) Int. Cl.
*H03B 19/00* (2006.01)
(52) U.S. Cl. .................. 327/116; 327/159; 327/160
(58) Field of Classification Search ................ 327/116, 327/119, 159, 160
See application file for complete search history.

(56) References Cited

U.S. PATENT DOCUMENTS

| | | | | |
|---|---|---|---|---|
| 3,916,175 A | * | 10/1975 | Lauer et al. ................. | 708/103 |
| 4,941,160 A | * | 7/1990 | Sheahan ........................ | 377/28 |
| 5,719,510 A | * | 2/1998 | Weidner ....................... | 327/119 |
| 5,729,166 A | * | 3/1998 | May et al. ................... | 327/116 |
| 6,657,463 B1 | * | 12/2003 | Velez ........................... | 327/116 |

* cited by examiner

*Primary Examiner*—Kenneth B. Wells
(74) *Attorney, Agent, or Firm*—Helen M. Galus

(57) ABSTRACT

A method and system utilize a processor's digital timer and two interrupts to form a frequency multiplier. The first interrupt's processing time window is definable by a first number of counts $C_1$ of the digital timer while the second interrupt's processing time window is definable by a second number of counts $C_2$ of the digital timer. A count value CV utilized by the system/method is based on a desired frequency multiplier N, the timer clock rate, and the time required for one cycle of an input signal. The first interrupt is triggered upon completion of one cycle of the input signal at which point the processing time window associated therewith begins. The second interrupt is triggered each time the timer's overflow signal is generated at which point the processing time window associated with the second interrupt begins. During the occurrence of the second interrupt's processing, the count value CV is modified to maintain the first interrupt's processing time window approximately centered between two of the second interrupt's processing time windows.

18 Claims, 2 Drawing Sheets

INTERRUPT-BASED PHASE-LOCKED FREQUENCY MULTIPLIER

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

1. Field of the Invention

This invention relates to phase-locked frequency multiplier systems and methods. More specifically, the invention is a method and system that utilizes processor interrupts to generate an output signal frequency that is a multiple of an input signal's frequency and phase-locked to the input signal.

2. Description of the Related Art

A frequency multiplier is generally used to generate an output signal having a frequency that is a multiple of an input signal's frequency. When the input signal is variable, it may also be necessary to synchronize the output signal to variations in the input signal's frequency and phase. For example, data acquisition systems are frequently synchronized to the periodic occurrence of some event, the frequency of which can vary over time.

Phase-locked loops (or PLLs as they are also known) are well known feedback circuits used to keep an output signal synchronized or locked with respect to variations in the input signal's frequency and phase. Conventional analog or digital PLLs are implemented in hardware. However, this means that circuits must be specially designed and built for different applications. This is wasteful given that many frequency multiplier applications requiring PLLs already have an under-utilized processing system associated therewith.

SUMMARY OF THE INVENTION

Accordingly, it is an object of the present invention to provide a method and system for realizing a phase-locked frequency multiplier in a conventional processor.

Other objects and advantages of the present invention will become more obvious hereinafter in the specification and drawings.

In accordance with at least one embodiment of the present invention, a method and system utilize a processor to generate an output signal at a frequency that is N times a frequency of an input signal and phase-locked thereto. The processor has (i) a digital timer/counter that operates at a known timer clock rate to generate an overflow signal each time the digital timer counts to a count value CV at the timer clock rate, and (ii) a plurality of interrupts to include a first interrupt having a first time window associated therewith during which processing can occur and a second interrupt having a second time window associated therewith during which processing can occur. The first interrupt's first time window is definable by a first number of counts $C_1$ of the digital timer while the second interrupt's second time window is definable by a second number of counts $C_2$ of the digital timer. A count value CV utilized by the system/method is based on a desired frequency multiplier N, the timer clock rate, and the time required for one cycle of the input signal. The digital timer's overflow signal is generated N times for one cycle of the input signal. The count value CV is greater than ($C_1+C_2$) such that the first time window and second time window can begin and elapse in a non-overlapping fashion during the time it takes for the digital timer to count to the count value CV. The digital timer is initialized such that the first time window begins at a timer count TC of the digital timer that is defined as TC=IC−0.5 ($C_1$) where an interim count IC defines a number of counts counted by the digital timer before the digital timer counts to the count value CV. As a result, the first time window is approximately centered at the interim count IC and the first time window and second time window do not overlap. The first interrupt is triggered upon completion of one cycle of the input signal at which point the first time window begins. The second interrupt is triggered each time the overflow signal is generated at which point the second time window begins. During the occurrence of the second time window, the count value CV is modified to maintain the first time window approximately centered at the interim count IC.

DETAILED DESCRIPTION OF THE INVENTION

Figure 1:
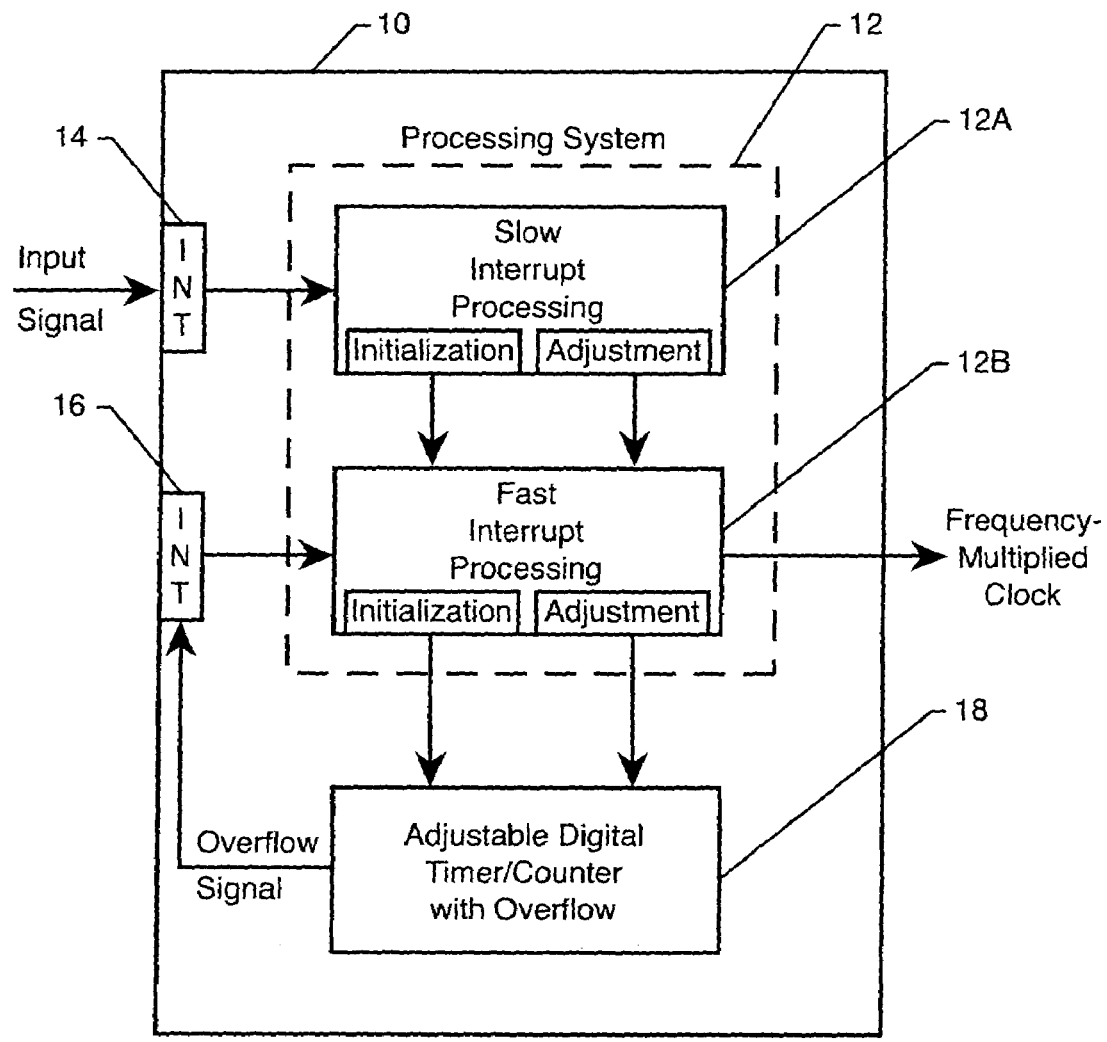
FIG. 1 is a block diagram of the relevant portions of a processing system used to implement the phase-locked frequency multiplier in accordance with the present invention.

Referring now to the drawings, and more particularly to FIG. 1, the relevant portions of a conventional processing system 10 used to implement a phase-locked frequency multiplier in accordance with the present invention are shown. As will be understood by one of ordinary skill in the art, processing system 10 can be realized by any of a variety of well known systems, the choice of which is not a limitation of the present invention.

At the hardware level, processing system 10 includes a central processing unit (CPU) 12, hardware interrupts 14 and 16, and a digital timer/counter 18. CPU 12 is the processing portion of system 10 that carries out programmed functions as is well known in the art. In terms of the present invention, as shown, CPU 12 carries out what will be referred to herein as slow interrupt processing 12A and fast interrupt processing 12B. The individual blocks for processing 12A and 12B are indicative of the fact that the processing for each is carried out in separate and non-overlapping windows of time as will be explained in greater detail later below. Each of slow interrupt processing 12A and fast interrupt processing 12B has initialization and adjustment modes of operation as will be explained further below.

Hardware interrupts 14 and 16 generate interrupts for CPU 12 based on the occurrence of an event. In terms of interrupt 14 which has a varying-frequency input signal coupled thereto, an interrupt is generated/sent to CPU 12 each time one cycle of the input signal is completed. The interrupt is used to initiate slow-interrupt processing 12A. Typically, the input signal is a pulse generated when a sensor (not shown) detects completion of one cycle. For example, if the input signal is indicative of the rotation of a (drive) shaft, the input signal could be generated by a position sensor that generates a pulse each time one revolution of the shaft is completed. Thus, changing rotational speeds of the shaft change the frequency of the input signal.

Interrupt 16 has the output of digital timer/counter 18 coupled thereto. That is, each time timer/counter 18 counts up (or down) to a specified (i.e., programmed) time/count, timer/counter 18 generates an overflow signal that is received by interrupt 16. The particular time/count used by timer/counter 18 is programmable and is set/programmed by fast interrupt processing 12B as will be explained further below. However, the rate at which timer/counter 18 times/counts is known and fixed. In response to the overflow signal, interrupt 16 generates/sends an interrupt to CPU 12. As is well known in the art, once timer/counter 18 generates the overflow signal, the prescribed time/count is restarted. Each interrupt generated at interrupt 16 is used to initiate fast interrupt processing 12B which, in turn, adjusts the time/count of timer/counter 18 and outputs a frequency-multiplied clock signal that is locked in phase with the input signal.

Figure 2:
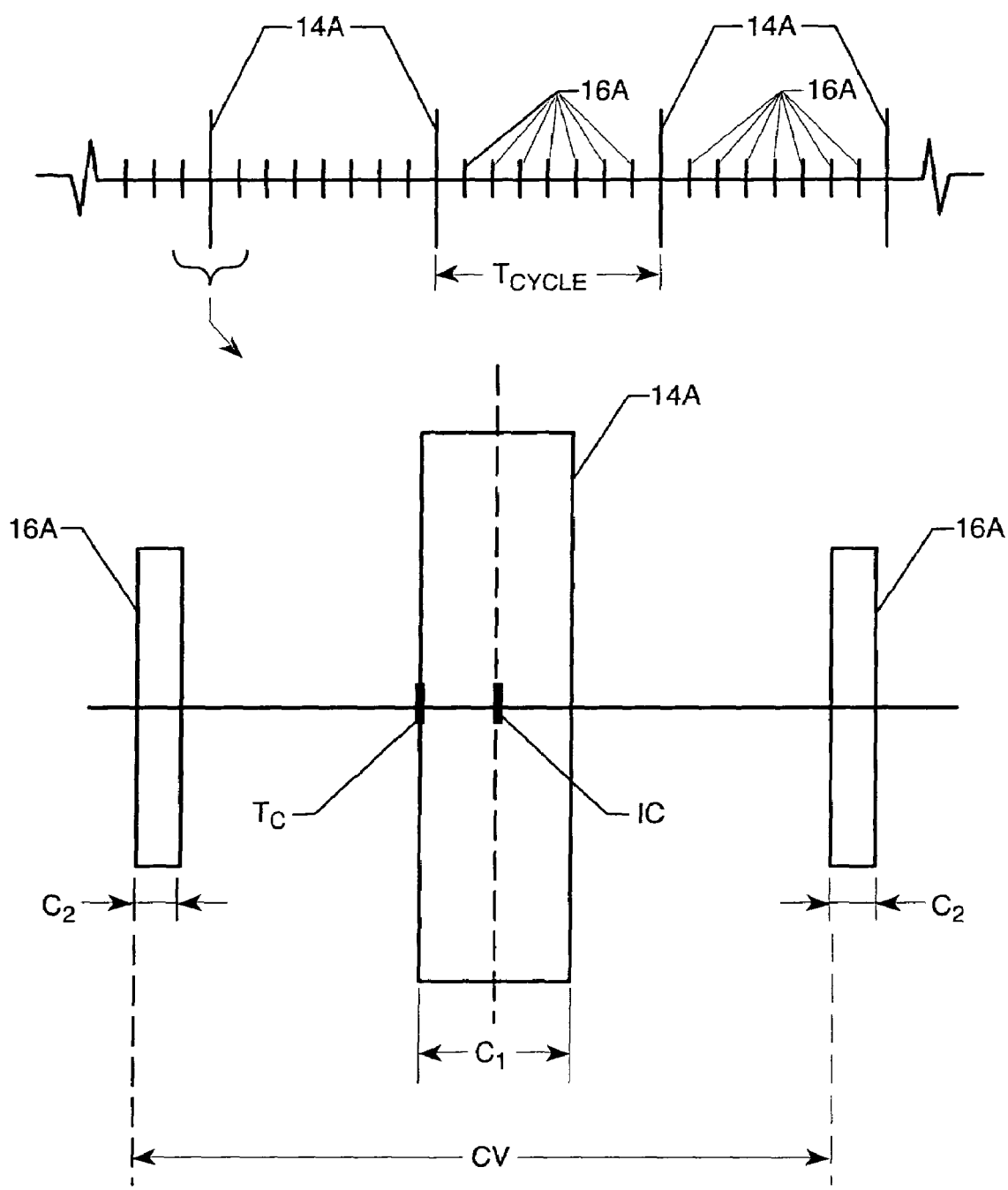
FIG. 2 is a time line illustrating the non-overlapping relationship between the fast and slow interrupts used to create a phase-locked frequency multiplier in accordance with the present invention.

Referring additionally now to FIG. 2, the operating principles of the present invention will be described. The operating principles form the programming logic for slow interrupt processing 12A and fast interrupt processing 12B to generate the frequency-multiplied clock signal that is phase-locked to the input signal. It is to be understood that the programming logic can be realized by a variety of programmed instruction sets that use a variety of program languages without departing from the scope of the present invention.

In FIG. 2, a time line is illustrated with fast interrupts (generated by interrupt 16) indicated by lines 16A and slow interrupts (generated by interrupt 14) indicated by lines 14A. In general, a number of fast interrupts occur between two slow interrupts (i.e., the time $T_{CYCLE}$ that it takes for one cycle of the input signal) such that the processing time required for each interrupt does not overlap with a previous or subsequent interrupt. The time window required for slow interrupt processing 12A and fast interrupt processing 12B is a function of the processing speed of CPU 12 and the amount of processing that must occur as would be well understood in the art.

The desired frequency multiplier or "N" is the ratio of the number of fast interrupts 16A per one slow interrupt 14A. The present invention achieves phase synchronization or "locking" to the input signal by maintaining the non-overlapping relationship between fast interrupts 16A and a slow interrupt 14A. This is accomplished by initially loading, or programming, timer/counter 18 with a particular time/count during the initialization processing mode, and then continually adjusting the time/count of timer/counter 18 in accordance with changes in the input signal during the adjustment processing mode.

Prior to describing the initialization and adjustment processing modes, nomenclature used to describe these modes will be defined with the aid of the expanded time line in FIG. 2 that illustrates one slow interrupt 14A occurring between two fast interrupts 16A. The time/count of timer/counter 18 between fast interrupts 16A is defined herein as a count value "CV." The time required for each slow interrupt processing 12A is designated as $C_1$ and the time required for each fast interrupt processing 12B is designated as $C_2$. Since timer/counter 18 is a digital timer, the values of CV, $C_1$ and $C_2$ are indicative of a number of digital "ticks" of timer/counter 18 which is operating at a known and fixed timer clock rate.

Synchronized and stable frequency multiplication is achieved by keeping the entirety of slow interrupt 14A between fast interrupts 16A. That is, slow interrupt 14A must begin (i.e., at a timer count "TC") and complete its processing during the time specified by $C_1$ before occurrence of the next fast interrupt 16A. This can be accomplished by centering slow interrupt 14A on an interim count "IC" of timer/counter 18 that allows slow interrupt 14A to begin and complete its processing between fast interrupts 16A. As a result, timer count $TC=IC-0.5(C_1)$. In order to provide for the maximum amount of positive/negative shift of slow interrupt 14A while preventing overlap with fast interrupts 16A, interim count IC should be approximately centered between two fast interrupts 16A or $IC=0.5(CV-C_2)$.

During the initialization processing mode, slow interrupt processing 12A generates the initial count value CV for timer/counter 18. The initial count value CV is determined/calculated based on the desired frequency multiplier N, the known timer clock rate of timer/counter 18, and a known measured or expected rate for one cycle of the input signal used to trigger (slow) interrupt 14. For example, for a frequency multiplier of N=100, a timer clock rate of 50 MHz, and an initial rate of 100 Hz for one cycle of the input signal, the initial count value CV is 5000 (wherein CV=Timer Clock rate÷(N×initial rate)). The initial count value CV can be calculated by slow interrupt processing 12A or can be predetermined and provided to slow interrupt processing 12A without departing from the scope of the present invention.

Initialization processing continues by synchronizing the cycle of the input signal (i.e., the start of slow interrupt 14A) with the timer count TC determined as described above. That is, fast interrupt processing 12B initializes timer/counter 18 to a timer count value such that the timer count value will be TC at the start of slow interrupt 14A. Once initialization is complete, slow interrupt processing 12A and fast interrupt processing 12B switch to an adjustment processing mode whereby adjustments in the count value CV of timer/counter 18 are made in order to keep slow interrupt 14A approximately centered on the interim count IC.

In the adjustment mode of processing, slow interrupt processing 12A recalculates the count value CV to accommodate changes in the frequency of the input signal. Ideally, the frequency multiplier times the updated count value (or N×CV) should equal the new "one cycle" time of the input signal or $T_{CYCLE}$. The updated count value CV is then provided to fast interrupt processing 12B which applies the adjustment over some or all of the fast interrupts 16A occurring between two slow interrupts 14A. The adjustment may be applied uniformly across the fast interrupts occurring between two slow interrupts. However, because of the discrete nature of timer/counter 18 and the likelihood that the required adjustment to count value CV will not be a multiple of N times the timer/counter base, the adjustment to count value CV may also be applied non-uniformly across the fast interrupts (occurring between two slow interrupts) as needed.

The methods used to adjust count value CV can be varied without departing from the scope of the present invention. Several non-exhaustive examples will be described briefly herein. One way to modify the count value CV is to (i) read the actual count on timer/counter 18 when a slow interrupt 14A occurs, (ii) compare the actual count with the initialized timer count TC, and (iii) modify the count value CV based on the results of the comparison. Another way to modify the count value CV involves an iterative adjustment process that automatically changes the count value CV by some pre-set positive or negative value until $TC=IC-0.5(C_1)$. Further, if necessary, any adjustment could be filtered (e.g., low-pass filtered) to reduce noise effects and increase stability of the software.

The advantages of the present invention are numerous. The interrupt-based phase-locked frequency multiplier can be implemented on a variety of conventional processing systems. No special hardware or circuitry is required. Tests of the present invention have yielded high and stable synchronization. The high frequency range of the system/method is limited only by the processing system's clock speed and the length of time it takes to execute the interrupt processing. Thus, the faster the processor, the greater the operational bandwidth of the frequency multiplier.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed is:

1. A method for generating an output signal at a frequency that is N times a frequency of an input signal and phase-locked to said input signal, comprising the steps of:
    providing processing means having (i) a digital timer adjustable to operate at a known timer clock rate to generate an overflow signal each time said digital timer counts to a count value CV at said tinier clock rate, and (ii) a plurality of interrupts to include a first interrupt having a first time window associated therewith during which processing occurs and a second interrupt having a second time window associated therewith during which processing occurs, said first time window definable by a first number of counts $C_1$ of said digital timer and said second time window definable by a second number of counts $C_2$ of said digital timer;
    determining said count value CV based on a desired frequency multiplier N, said timer clock rate, and time required for one cycle of said input signal, wherein said overflow signal is generated N times for said one cycle and wherein said count value CV is greater than ($C_1+C_2$) such that said first time window and said second time window begin and elapse in a non-overlapping fashion during the time it takes for said digital timer to count to said count value CV;
    selecting an interim count IC that defines a number of counts counted by said digital timer before said digital timer counts to said count value CV;
    initializing said digital timer such that said first time window begins at a timer count TC of said digital timer defined as TC=IC−0.5($C_1$), wherein said first time window is approximately centered at said interim count IC and wherein said first time window and said second time window do not overlap;
    using said one cycle of said input signal to trigger said first interrupt, at which point said first time window begins;
    using said overflow signal to trigger said second interrupt, at which point said second time window begins; and
    modifying, during the occurrence of said second time window, said count value CV to maintain said first time window approximately centered at said interim count IC.

2. A method according to claim 1 wherein said interim count is selected to be approximately 0.5(CV−$C_2$).

3. A method according to claim 1 wherein said step of modifying comprises the steps of:
    determining an actual count AC of said digital timer each time said first interrupt is triggered; and
    modifying said count value CV based on a difference between said actual count AC and said timer count TC.

4. A method according to claim 1 wherein said step of modifying comprises the steps of:
    initially modifying said count value CV such that said first time window begins and elapses between successive occurrences of said second time window; and
    iteratively modifying, after successful completion of said step of initially modifying, said count value CV until said first time window is approximately centered at said interim count IC.

5. A method according to claim 4 wherein said second interrupt is triggered N times for said one cycle of said input signal such that said second time window correspondingly begins and elapses N times for said one cycle of said input signal, and wherein said step of iteratively modifying comprises the step of adjusting said count value CV uniformly over said N times.

6. A method according to claim 4 wherein said second interrupt is triggered N times for said one cycle of said input signal such that said second time window correspondingly begins and elapses N times for said one cycle of said input signal, and wherein said step of iteratively modifying comprises the step of adjusting said count value CV nonuniformly over said N times.

7. A method for generating an output signal at a frequency that is N times a frequency of an input signal and phase-locked to said input signal, comprising the steps of:
    providing processing means having (i) a digital timer adjustable to operate at a known timer clock rate to generate an overflow signal each time said digital timer counts to a count value CV at said timer clock rate, and (ii) a plurality of interrupts to include a first interrupt having a first time window associated therewith during which processing occurs and a second interrupt having a second time window associated therewith during which processing occurs, said first time window definable by a first number of counts $C_1$ of said digital timer and said second time window definable by a second number of counts $C_2$ of said digital timer, wherein said count value CV is based on a desired frequency multiplier N, said timer clock rate, and time required for one cycle of said input signal, and wherein said overflow signal is generated N times for said one cycle and wherein said count value CV is greater than ($C_1+C_2$) such that said first time window and said second time window begin and elapse in a non-overlapping fashion during the time it takes for said digital timer to count to said count value CV;
    initializing said digital tinier such that said first time window begins at a timer count TC of said digital timer defined as TC=IC−0.5($C_1$) where an interim count IC defines a number of courts counted by said digital timer before said digital timer counts to said count value CV, wherein said first time window is approximately centered at said interim count IC and wherein said first time window and said second time window do not overlap;
    triggering said first interrupt upon completion of said one cycle of said input signal, at which point said first time window begins;
    triggering said second interrupt each time said overflow signal is generated, at which point said second time window begins; and modifying, during the occurrence of said second time window, said count value CV to maintain said first time window approximately centered at said interim count IC.

8. A method according to claim 7 wherein said interim count is approximately $0.5(CV-C_2)$.

9. A method according to claim 7 wherein said step of modifying comprises the steps of:
   determining an actual count AC of said digital timer each time said first interrupt is triggered; and
   modifying said count value CV based on a difference between said actual count AC and said timer count TC.

10. A method according to claim 7 wherein said step of modifying comprises the steps of:
    initially modifying said count value CV such that said first time window begins and elapses between successive occurrences of said second time window; and
    iteratively modifying, after successful completion of said step of initially modifying, said count value CV until said first time window is approximately centered at said interim count IC.

11. A method according to claim 10 wherein said second interrupt is triggered N times for said one cycle of said input signal such that said second time window correspondingly begins and elapses N times for said one cycle of said input signal, and wherein said step of iteratively modifying comprises the step of adjusting said count value CV uniformly over said N times.

12. A method according to claim 10 wherein said second interrupt is triggered N times for said one cycle of said input signal such that said second time window correspondingly begins and elapses N times for said one cycle of said input signal, and wherein said step of iteratively modifying comprises the step of adjusting said count value CV nonuniformly over said N times.

13. A frequency multiplier comprising processing means having (i) a digital timer adjustable to operate at a known timer clock rate to generate an overflow signal each time said digital timer counts to a count value CV at said timer clock rate, and (ii) a plurality of interrupts to include a first interrupt having a first dine window associated therewith during which processing occurs and a second interrupt having a second time window associated therewith during which processing occurs, said first time window definable by a first number of counts $C_1$ of said digital timer and said second time window definable by a second number of counts $C_2$ of said digital timer, wherein said count value CV is based on a desired frequency multiplier N, said timer clock rate, and time required for one cycle of an input signal, and wherein said overflow signal is generated N times for said one cycle and wherein said count value CV is greater than $(C_1+C_2)$ such that said first time window and said second time window begin and elapse in a non-overlapping fashion during the time it takes for said digital timer to count to said count value CV, said digital timer being initialized such that said first time window begins at a timer count TC of said digital timer defined as $TC=IC-0.5(C_1)$ where an interim count IC defines a number of counts counted by said digital timer before said digital timer counts to said count value CV, wherein said first time window is approximately centered at said interim count IC and wherein said first time window and said second time window do not overlap, said first interrupt adapted to receive said input signal for triggering upon completion of said one cycle of said input signal, at which point said first time window begins, said second interrupt coupled to said digital timer for triggering each time said overflow signal is generated, at which point said second time window begins, and said processing means modifying, during the occurrence of said second time window, said count value CV to maintain said first time window approximately centered at said interim count IC.

14. A frequency multiplier as in claim 13 wherein said interim count is approximately $0.5(CV-C_2)$.

15. A frequency multiplier as in claim 13 wherein said processing means (i) determines an actual count AC of said digital timer each time said first interrupt is triggered, and (ii) modifies said count value CV based on a difference between said actual count AC and said timer count TC.

16. A frequency multiplier as in claim 13 wherein said processing means (i) initially modifies said count value CV such that said first time window begins and elapses between successive occurrences of said second time window, and (ii) subsequently modifies said count value CV in an iterative fashion until said first time window is approximately centered at said interim count IC.

17. A frequency multiplier as in claim 16 wherein said second interrupt is triggered N times for said one cycle of said input signal such that said second time window correspondingly begins and elapses N times for said one cycle of said input signal, and wherein said processing means adjusts said count value CV uniformly over said N times.

18. A frequency multiplier as in claim 16 wherein said second interrupt is triggered N times for said one cycle of said input signal such that said second time window correspondingly begins and elapses N times for said one cycle of said input signal, and wherein said processing means adjusts said count value CV nonuniformly over said N times.

* * * * *